(12) United States Patent
Casset et al.

(10) Patent No.: US 10,532,379 B2
(45) Date of Patent: Jan. 14, 2020

(54) MECHANICAL STRUCTURE COMPRISING AN ACTUATOR AND MECHANICAL AMPLIFICATION MEANS, AND PRODUCTION METHOD

(71) Applicants: COMMISSARIAT A L'ENERGIE ATOMIQUE ET AUX ENERGIES ALTERNATIVES, Paris (FR); STMicroelectronics (Crolles 2) SAS, Crolles (FR); UNIVERSITE GRENOBLE ALPES, Saint Martin d'Heres (FR)

(72) Inventors: Fabrice Casset, Tencin (FR); Skandar Basrour, Grenoble (FR); Cédrick Chappaz, Crolles (FR); Jean-Sébastien Danel, Echirolles (FR)

(73) Assignees: COMMISSARIAT A L'ENERGIE ATOMIQUE ET AUX ENERGIES ALTERNATIVES, Paris (FR); STMICROELECTRONICS (CROLLES 2) SAS, Crolles (FR); UNIVERSITÉ GRENOBLE ALPES, Saint Martin d'Heres (FR)

(*) Notice: Subject to any disclaimer, the term of this patent is extended or adjusted under 35 U.S.C. 154(b) by 304 days.

(21) Appl. No.: 15/515,856

(22) PCT Filed: Sep. 30, 2015

(86) PCT No.: PCT/EP2015/072536
§ 371 (c)(1),
(2) Date: Mar. 30, 2017

(87) PCT Pub. No.: WO2016/050832
PCT Pub. Date: Apr. 7, 2016

(65) Prior Publication Data
US 2017/0304867 A1   Oct. 26, 2017

(30) Foreign Application Priority Data

Oct. 2, 2014  (FR) .................................... 14 59430

(51) Int. Cl.
*H01L 41/09* (2006.01)
*B06B 3/00* (2006.01)
(Continued)

(52) U.S. Cl.
CPC ............... *B06B 3/00* (2013.01); *B06B 1/045* (2013.01); *B06B 1/06* (2013.01); *B81B 3/0021* (2013.01);
(Continued)

(58) Field of Classification Search
CPC .. B06B 3/00; B06B 1/045; B06B 1/06; B81B 3/0021; B81B 3/0024; B81B 2201/032; H01L 41/094; H01L 41/18; H01L 41/25
(Continued)

(56) References Cited

U.S. PATENT DOCUMENTS

2008/0076211 A1* 3/2008 Casset ................... B81C 1/0065
                                                              438/127
2010/0090565 A1   4/2010 Bhaskaran et al.
(Continued)

*Primary Examiner* — Thomas M Dougherty
(74) *Attorney, Agent, or Firm* — Baker & Hostetler LLP (57) ABSTRACT

A mechanical structure comprising a stack including an active substrate and at least one actuator designed to generate vibrations at the active substrate, the stack comprises an elementary structure for amplifying the vibrations: positioned between the actuator and the active substrate, the structure designed to transmit and amplify the vibrations; and comprising at least one trench, located between the actuator and the active substrate. A method for manufacturing the structure comprising the use of a temporary substrate is provided.

13 Claims, 5 Drawing Sheets

(51) Int. Cl.
*B81B 3/00* (2006.01)
*B06B 1/04* (2006.01)
*B06B 1/06* (2006.01)
*H01L 41/18* (2006.01)
*H01L 41/25* (2013.01)

(52) U.S. Cl.
CPC .......... *B81B 3/0024* (2013.01); *H01L 41/094* (2013.01); *H01L 41/18* (2013.01); *H01L 41/25* (2013.01); *B81B 2201/032* (2013.01)

(58) Field of Classification Search
USPC ........................................ 310/311–369, 800
See application file for complete search history.

(56) References Cited

U.S. PATENT DOCUMENTS

| | | | |
|---|---|---|---|
| 2013/0241350 A1* | 9/2013 | Shibamoto | G10K 11/002 310/322 |
| 2013/0342075 A1 | 12/2013 | Seddik et al. | |
| 2015/0165479 A1* | 6/2015 | Lasiter | B06B 1/0666 310/322 |

* cited by examiner

MECHANICAL STRUCTURE COMPRISING AN ACTUATOR AND MECHANICAL AMPLIFICATION MEANS, AND PRODUCTION METHOD

CROSS-REFERENCE TO RELATED APPLICATIONS

This application is a National Stage of International patent application PCT/EP2015/072536, filed on Sep. 30, 2015, which claims priority to foreign French patent application No. FR 1459430, filed on Oct. 2, 2014, the disclosures of which are incorporated by reference in their entirety.

FIELD OF THE INVENTION

The invention generally relates to mechanical structures in which it is sought to transmit a deformation or a vibration mode to a mechanical element using an actuator and, in particular, to an actuator produced by means of microelectronics techniques.

This problem is relevant to a great many fields of application, such as those non-exhaustively mentioned below.

BACKGROUND

Nowadays actuators, for example ceramic piezoelectric actuators, are employed by various systems (touchpads, inkjet, etc.). These ceramics must be placed individually onto the final system and require high actuation voltages (typically 100 to 200 V).

In parallel, the use of actuators deposited in thin layers by means of microelectronics methods allows numerous systems to be batch-produced by virtue of step sharing (one microelectronics step is carried out at the same time on all of the systems present on the substrate), and thus allows manufacturing costs to be decreased. Moreover, thin film actuators allow electromechanical systems to be actuated through the use of low voltages (typically 10 to 20 V). However, due to their low thickness and small dimensions, the deformation afforded by these actuators is less than that obtained when using piezoelectric ceramics, and they transmit less force or entrain less movement than ceramics.

One exemplary application relates to haptic interfaces. Currently, mobile telephone manufacturers that have entered the touchscreen cell phone market seek to distinguish themselves by integrating haptic interfaces with force feedback into their units. Thus, when a user slides his or her finger over an icon located on the screen, he or she may feel a slight vibration arising from the cell phone, which vibration is intended to convey the sensation of pressing a button. However, nowadays, haptic systems embedded, for example, in cell phones exhibit a limited haptic effect (simple vibration) and overly high power consumption.

Another exemplary application for which it is advantageous to amplify the deformation of an actuator is found in those fields in which it is sought to produce a variable capacitor or switch.

This problem is also encountered when it is sought to produce, for example, an MEMS loudspeaker using an actuator on a diaphragm. The actuation of the diaphragm allows an acoustic pulse to be produced.

This same problem is also relevant to the field of photoacoustic imaging. In this case the acoustic pulse, generated by the movement of air entrained by the actuation of the diaphragm, is delivered to a cell or an element to be "probed". The reflection of the acoustic wave may be recorded and analyzed in order to produce images.

Other fields of application may also be mentioned, such as those of micropumps, where the movement of a diaphragm is used as a micropump for example in order to dispense insulin or any other drug.

Within this general context, it remains advantageous and necessary to be able to have small structures available in which an effect initiated by an actuator may be transmitted, while being amplified, to an element to which this actuator is coupled.

SUMMARY OF THE INVENTION

For this reason, a subject of the invention is a mechanical structure comprising a stack including an active substrate and at least one actuator designed to generate vibrations at said active substrate, said stack comprising an elementary structure for amplifying said vibrations:

positioned between said actuator and said active substrate, the structure being designed to transmit and amplify said vibrations; and comprising at least one trench, located between said actuator and said active substrate.

According to one variant of the invention, as the active substrate is oriented along a first plane defined by two orthogonal axes X and Y, defined in an orthonormal coordinate system (X, Y, Z), the trench is oriented along a plane comprising an axis Z' forming an angle $\theta$ with said axis Z, this angle potentially being zero.

According to one variant of the invention, said elementary structure comprises a stack of layers at least one layer of which comprises said trench.

According to one variant of the invention, said trench is open at least up to said active substrate.

According to one variant of the invention, a surface of the substrate is oriented in a first plane defined by two orthogonal axes X and Y, said elementary structure comprises trenches that are distributed periodically along said first plane between said actuator and said substrate.

According to one variant of the invention, said structure comprises multiple actuators coupled with at least one elementary amplification structure, on said active substrate.

According to one variant of the invention, the actuator is a piezoelectric actuator.

According to one variant of the invention, the piezoelectric actuator comprises at least one layer of piezoelectric material that may be made of PZT, AlN, LNO or BST.

According to one variant of the invention, the actuator comprises a thermal resistor that may comprise at least one metal layer, designed to carry out a thermal actuation.

According to one variant of the invention, the actuator comprises at least one layer made of magnetic material, allowing a magnetic actuation to be carried out.

According to one variant of the invention, the active substrate is entirely or partly made of glass, polymer, or silicon.

This substrate may be homogeneous (also referred to as a bulk substrate) or heterogeneous, i.e. including a stack of layers.

According to one variant of the invention, the elementary structure comprises at least one portion made of silicon.

According to one variant of the invention, said structure comprises:

an actuator that may comprise a piezoelectric layer;
an elementary structure made of silicon;
an active substrate made of glass.

According to one variant of the invention, the width of the trench or trenches is between approximately 5 µm and 1000 µm and, in the case of multiple trenches, they are spaced apart by a distance that may typically be between 5 µm and 1000 µm.

Another subject of the invention is a method for manufacturing a mechanical structure comprising a stack including an active substrate and at least one actuator designed to generate vibrations at said active substrate, said stack comprising an elementary structure for amplifying said vibrations:

positioned between said actuator and said active substrate, the structure being designed to transmit and amplify said vibrations; and comprising at least one trench, located between said actuator and said active substrate, characterized in that it comprises the following steps:

producing at least one actuator on the surface of an elementary substrate;

an operation of bonding said elementary substrate, on the actuator side, to a temporary substrate;

producing at least one trench in said elementary substrate, in the face opposite that including said actuator, the elementary substrate and said trench forming an elementary amplification structure;

an operation of bonding, on the trench side, said elementary substrate comprising at least said trench to the active substrate;

an operation of removing the temporary substrate in order to free the actuator.

According to one variant of the invention, the elementary substrate is entirely or partly made of silicon, the active substrate is entirely or partly made of glass and the actuator is entirely or partly made of piezoelectric material.

According to one variant of the invention, said method comprises:

the deposition of at least one metal layer on the faces to be bonded to the elementary substrate and to the active substrate, respectively;

bonding, by means of thermocompression, said faces including said metal layers.

According to one variant of the invention, said method comprises an operation of thinning said elementary substrate from said face opposite that including said actuator, this step being carried out before the bonding step and before or after producing the trench.

According to one variant of the invention, the operation of bonding said temporary substrate is carried out using a polymer.

BRIEF DESCRIPTION OF THE DRAWINGS

The invention will be better understood and other advantages will become apparent on reading the following description, which is given by way of non-limiting example, and by virtue of the appended figures in which.

DETAILED DESCRIPTION

In general, the mechanical structure of the present invention includes a substrate through which it is sought to transmit vibrations, an actuator generating said vibrations and an elementary amplification structure comprising at least one trench.

Figure 1:
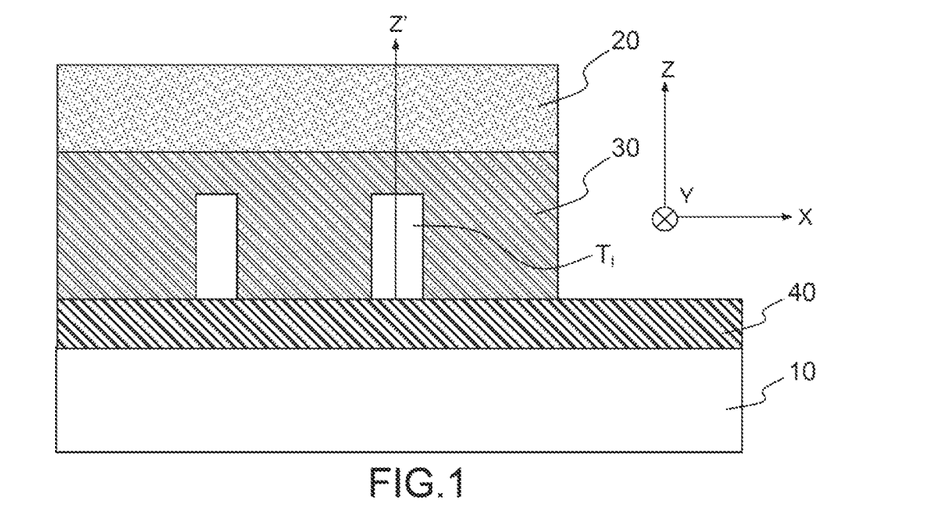
FIG. 1 illustrates an example of a mechanical structure according to the invention.

FIG. 1 schematically shows an exemplary mechanical structure of the invention and highlights an active substrate 10 through which it is sought to propagate a vibration mode from an actuator 20 via an elementary amplification structure 30 comprising at least one, or even multiple, trenches Ti (two in FIG. 1), the elementary structure 30 being secured to said substrate by means of, for example, an adhesive layer 40.

According to this example, the active substrate is oriented along a first plane defined by two orthogonal axes X and Y in an orthonormal coordinate system (X, Y, Z). The trenches are oriented along a plane comprising an axis Z' merged with the Z axis.

According to other possible configurations, the trenches could be oriented along planes comprising an axis Z' forming a non-zero angle with the Z axis.

Typically, in various applications, the positioning of multiple actuators is optimized on the surface of a substrate, referred to as an active substrate, through which it is sought to propagate vibration modes and, preferably, a mode centered on an optimum frequency.

The actuator 20, which may be piezoelectric, thermal or magnetic, may contract or expand. By virtue of the bimaterial strip effect, due to the presence of the elementary structure 30 that links it to the element to be deformed, the actuator effects a torque on the element to be deformed. This torque is amplified by virtue of the lever arm effect of the intermediate layer.

The applicants have carried out simulations allowing the concept of the present invention to be validated using Coventor finite element computing software.

More specifically, the applicants have simulated the transmission of a vibration mode, which may be referred to as a "corrugated sheet" vibration mode, to a substrate by means of a thin film actuator, this being particularly advantageous for touchpad applications.

Figure 2A:
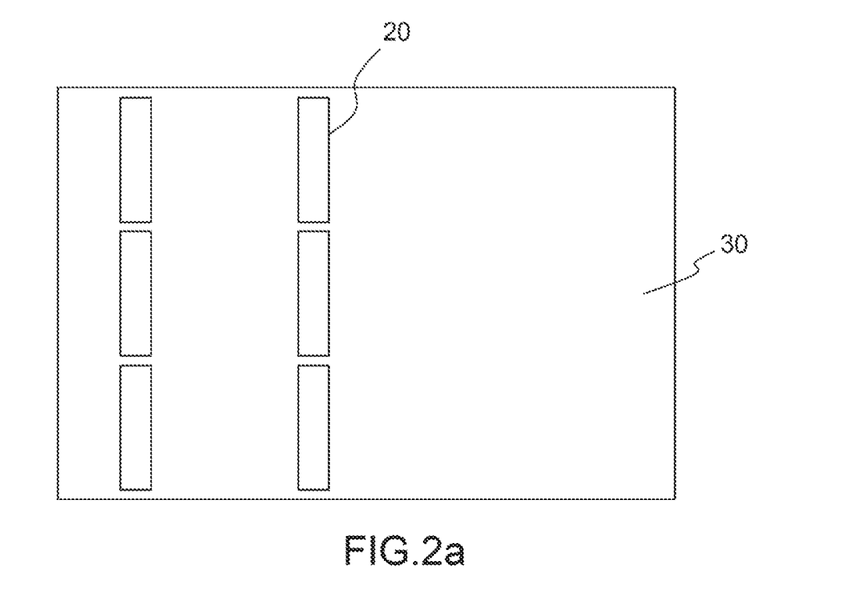
FIGS. 2a and 2b illustrate views from above of a mechanical structure according to the prior art using a bulk silicon wafer and a structure of the invention using a silicon wafer comprising trenches, respectively.

In this context, the simulations were carried out with optimization of the positioning of multiple actuators 20 such as illustrated in FIG. 2a. Two rows of three actuators are positioned on the surface of an intermediate silicon structure 30, for the purpose of transferring a vibration mode to a glass plate. The vibration mode referred to as a "corrugated sheet" vibration mode is also affected by the dimensions of the actuators (their width and their length).

The various following cases were simulated using a PZT (lead zirconate titanate)-based actuator and on a glass plate substrate.

1) PZT/glass: this could correspond to an ideal case but it is currently difficult to envisage it from a technological standpoint considering the constraints in producing a PZT thin film on glass, in particular due to the high temperatures involved when shaping the PZT;

2) PZT/gold/glass: the use of an intermediate gold layer has therefore been envisaged, corresponding, from a technological standpoint, to a transfer of the PZT actuator to a glass plate after removal of the silicon substrate used during the production of the PZT;

3) PZT/Si 10 μm/gold/glass: transferring the PZT actuator to a glass plate after thinning the silicon substrate potentially being used during the production of the PZT has also been envisaged, the intermediate layer between the PZT and the glass being a gold/silicon bilayer;

4) PZT/Si 100 μm/gold/glass: yet another envisagement is to transfer the PZT actuator to a glass plate after thinning, although less substantially than in the preceding case, the silicon substrate potentially being used during the production of the PZT, the intermediate layer between the PZT and the glass therefore being a gold/silicon bilayer;

The materials mentioned above are given by way of indication, mainly to highlight the difference in transmission of the mode to the substrate that is capable of being deformed by the action of the thin film actuator when an intermediate structure is present.

The intermediate structure may thus be composed of one or more layers of various materials. It fulfills a mechanical role, allowing the actuator to be transferred and bonded to the vibrating element. It may be composed of a gold, oxide or silicon layer. It may also be composed, in a non-limiting manner, of a gold/silicon, oxide/silicon or even oxide/gold/silicon multilayer stack.

The applicants have thus obtained the following simulation results, summarized in table 1 below:

|  | PZT/glass | PZT/gold/glass | PZT/Si 10 μm/ gold/glass | PZT/Si 100 μm/ gold/glass |
|---|---|---|---|---|
| Frequency of the mode | 20.898 KHz | 20.898 KHz | 21.102 KHz | 21.918 KHz |
| Amplitude of vibration | 45 μm | 28 μm | 18 μm | 16 μm |

The amplitudes of vibration were simulated with arbitrary air damping below −30 V.

These results are relative and not absolute; in order to obtain absolute amplitudes, it would be necessary to extract, beforehand, a damping coefficient based on measurement. More specifically, a simulation is carried out while introducing a damping coefficient that is adjusted so that the simulation provides a result in close agreement with the measurement made on the produced device.

It appears that the presence of a gold layer causes the amplitude of vibration of the plate to fall substantially with respect to the ideal case of PZT/glass. The applicants have additionally observed that the presence of a gold layer leads to the occurrence of parasitic modes.

By retaining 10 μm or 100 μm of silicon, the amplitude of vibration is further dampened (since the presence of the silicon leads to an increase in the overall rigidity of the system) and parasitic modes occur all the more frequently, until ultimately obtaining the mode becomes very uncertain.

Figure 2B:
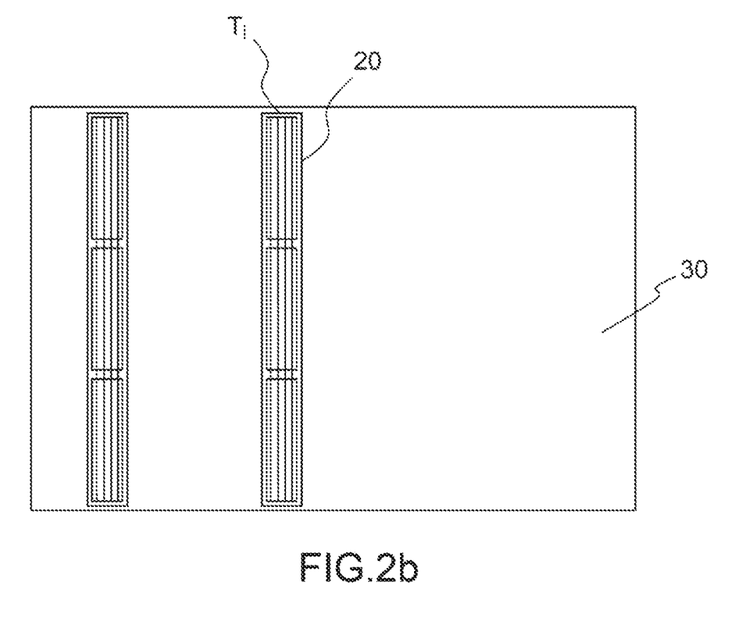

On the basis of these simulations, the applicants have studied the effect of introducing trenches into an intermediate silicon structure, allowing the lever arm effect to be applied, in a configuration illustrated in FIG. 2b that schematically shows trenches Ti produced in the amplifier structure 30.

Figure 3:
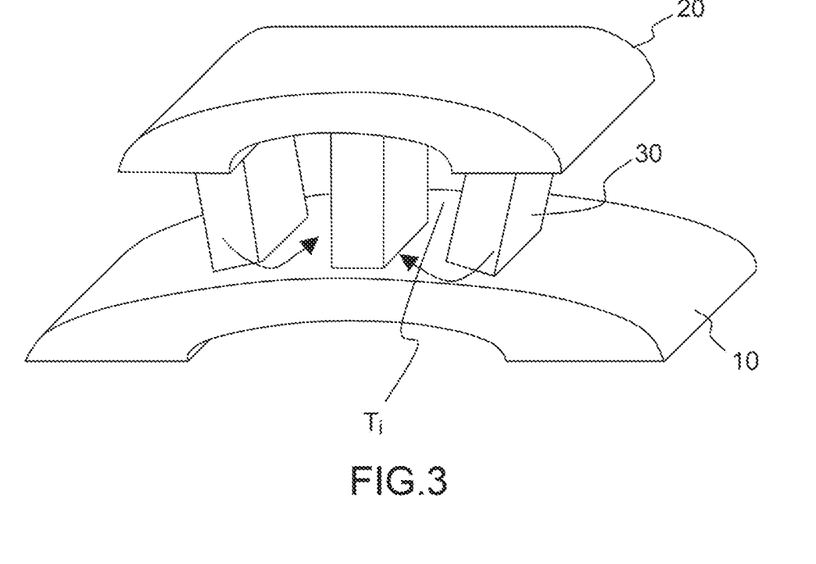
FIG. 3 schematically shows the deformation under stress of a mechanical structure of the invention.

The lever arm effect is schematically shown in FIG. 3. The actuator 20, which may be piezoelectric, thermal or magnetic, may contract or expand. By virtue of the bimaterial strip effect, due to the presence of the intermediate amplification structure 30 that links it to the element to be deformed, the actuator effects a torque that is transmitted to the element to be deformed. This torque is amplified by virtue of the lever arm effect of the intermediate layer 30.

Thus, by using the elementary structure of the invention with trenches, it becomes possible to favor the deformation to be transmitted to the element to be deformed, or the desired mode, and even to increase its amplitude with respect to the case of the mode obtained with the presence of the same silicon layer without trenches, as shown in table 2 below:

TABLE 2

|  | PZT/gold | PZT/gold/glass | PZT/Si 10 μm/gold/glass | PZT/Si 100 μm/gold/glass | PZT/trenched Si 10 μm/ gold/glass |
|---|---|---|---|---|---|
| Frequency of the mode | 20.898 KHz | 20.898 KHz | 21.102 KHz | 21.918 KHz | 20.898 KHz |
| Amplitude of vibration | 45 μm | 28 μm | 18 μm | 16 μm | 25 μm |

Thus, by introducing trenches into the silicon structure, the presence of silicon under the actuator becomes an advantage rather than a drawback. The silicon trenches fulfill the role of a lever arm by amplifying the amplitude of the mode (25 μm with trenches in the silicon versus 18 μm for the same thickness of silicon without trenches). The trenches also fulfill the role of a filter by favoring the desired mode. Specifically, the applicants have observed that the desired mode was retained while parasitic modes were eliminated.

The layers mentioned above, forming the mechanical structure of the invention, are only given by way of example and the present invention may be generalized to piezoelectric materials other than PZT and to types of actuators other than piezoelectric actuators.

Thus, the piezoelectric material may be PZT, AlN, LNO or BST, inter alia.

The actuator may be a thermal actuator (the same basic layout as a piezoelectric actuator, the actuator in this case is a thermal resistor, typically a metal such as aluminum or gold, etc.) or a magnetic actuator (in this case the actuator is a magnetic material).

The substrate referred to as the active substrate may be made of glass or polymer, inter alia.

The amplifier structure may comprise intermediate layers that may be made of oxide, silicon, polysilicon, gold, etc.

The trenches may be provided solely in the silicon since this solution is technologically easy to achieve. However, it is possible to envisage open trenches reaching from the substrate, referred to as the active substrate, to the actuator.

The thicknesses of the materials of the amplifier structure may typically be between a few hundred nanometers and a few microns, or even a few tens of microns.

Typically, the amplification structure may be made of silicon, the adhesive layer being metal, for example made of gold.

The applicants have also demonstrated that an optimum thickness of the amplifier structure could exist.

Figure 4:
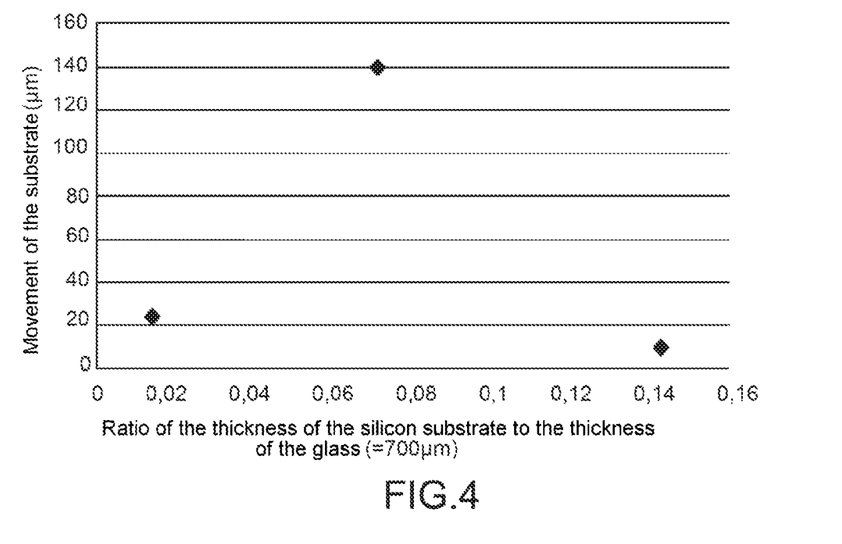
FIG. 4 illustrates the variation in the amplitude of deformation of a glass substrate in various configurations linked to various ratios of the thickness of the silicon substrate to the thickness of the glass for an exemplary mechanical structure of the invention.

To achieve this, various FEM simulations using Coventor software were carried out in order to find the optimum silicon substrate thickness. The silicon substrate being used as a carrier during the production of the PZT thin film actuators must be thinned. As shown in FIG. 4, an optimum exists, and a remaining thickness of silicon of the order 40 to 60 µm seems to allow the greatest deformation of the substrate.

This value is linked to the thickness and to the nature of the glass substrate that were used in the simulation, namely 700 µm, but the methodology may be applied to other dimensions and to other materials.

The applicants have thus established a curve relating to the movement of the substrate, illustrated by the amplitude of the vibration mode of interest as a function of the ratio of the thicknesses: thinned silicon/glass active substrate. The optimum is thus located at around 0.08.

Likewise, the applicants have demonstrated that the distribution of the trenches, along with their dimensioning, in the amplifier structure allows the amplification phenomenon to be enhanced.

Trenches that are too fine and/or too close to one another will not allow the rigidity caused by the silicon to be substantially decreased, while trenches that are too wide and too far apart, which greatly decreases the rigidity, lead to problems from a technological standpoint, such as poor bonding. It is therefore necessary to find the best compromise between these two effects.

The applicants have demonstrated the high performance levels obtained with trenches from 5 to 1000 µm and spaced apart by a distance that may typically be between 5 and 1000 µm and, more particularly, with trenches of 300 µm in width and spaced apart by 400 µm.

It should be noted that the silicon layer may be fully trenched (trenched through the thickness of the silicon) or partially trenched, as given in table 3 below.

TABLE 3

| Case | Open trenches | Partial trenches (10 µm of Si remaining) | Partial trenches (20 µm of Si remaining) |
| --- | --- | --- | --- |
| Amplitude of deformation of the substrate (simulation by means of finite element method with −30 V applied to the piezoelectric material) | 140 µm | 50 µm | 15 µm |
| Main stress (relative comparison) | 630 | 380 | 250 |

It appears that if some efficiency of amplification of the mechanical movement is sacrificed through the use of partial trenches (the amplitude of deformation of the substrate goes from 140 to 50 then 15 µm), then it is possible to greatly decrease the stress generated in the actuator by the deformation of the substrate (main stress going from 630 to 380 then 250). This decrease in stress may increase the reliability of the system.

Open trenches, leading to a greater degree of amplification, may thus be favored.

First Exemplary Application Using the Structure of the Invention: Touchpad.

In general, a touchpad operates by means of an air blade effect, produced on the surface of the plate by means of the vibration of the latter. This vibration is caused by piezoelectric actuators that are bonded or deposited and etched on the wafer.

In order to achieve a good haptic effect, it is necessary to obtain an amplitude of vibration typically of around 1 µm in the "corrugated sheet" mode.

Due to its high piezoelectric coefficient, PZT corresponds to an excellent candidate for producing actuators in order to obtain high-performance embedded touchpads using low actuation voltages, in particular in comparison with other piezoelectric materials such as LNO or AlN.

Since touchpads are especially used for smartphone or tablet PC applications, the use of a transparent vibrating plate is required, and hence it may not be made of silicon.

Since a direct deposition of PZT material on glass is not compatible with the high crystallization temperatures required for PZT deposited using the sol-gel process, the use of an intermediate structure is also required, as explained above.

In this context, the present invention is of particular advantage in that it allows, via the use of a required intermediate structure, the latter to be made into an amplifier of transmitted vibration modes.

For the production of such, one variant of the present invention consists of transferring the PZT actuators produced on silicon to a glass wafer.

To achieve this, strips of PZT actuators produced on silicon used as an elementary substrate may be diced and fixed to a temporary substrate, referred to hereinafter as a temporary handle, allowing the silicon substrate to be removed or partially thinned, then the actuator strips to be transferred and fixed to the glass plates by means of metal-metal, for example gold-gold, thermocompression.

Second Exemplary Application Using the Structure of the Invention: Variable Capacitor or Switch.

Figure 5:
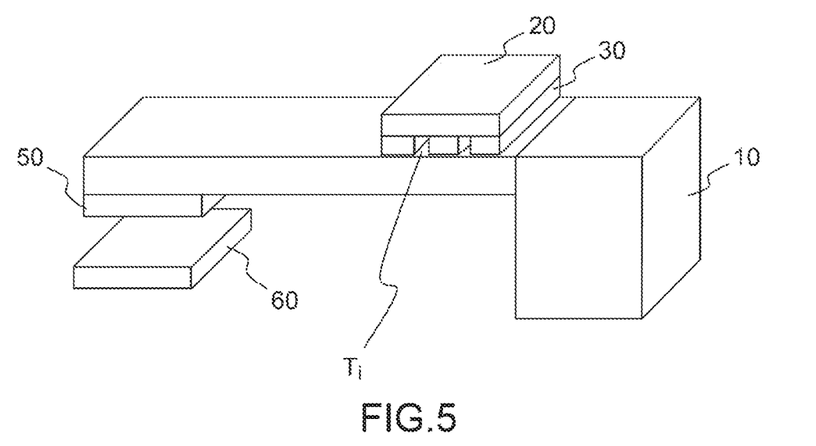
FIG. 5 illustrates an exemplary application using the structure of the invention in a variable capacitor or switch type application.

FIG. 5 thus illustrates an example in which the deformation of an actuator 20 is amplified via an amplification structure 30 comprising trenches Ti, said deformation potentially being amplified and transmitted to a beam, for example 10, in order to produce a switch or a variable capacitor, endowed with a specific contact or with a mobile electrode 50 facing a contact or a fixed electrode 60. This contact or fixed electrode is positioned on a mechanical support on which the variable capacitor or switches are produced. In particular, this mechanical support may be a silicon substrate. In this case, a cantilever or fixed-end beam is deformed under the effect of a voltage applied to the actuator. The deformation of the beam is amplified in order to bring the mobile element and the fixed element into contact more quickly, or in order to increase the difference in capacitance between the two electrodes facing one another.

Other examples may also be mentioned, such as:
those using a diaphragm, in particular:

- a loudspeaker using a MEMS component comprising a diaphragm, activated by an actuator, the actuation of the diaphragm allowing an acoustic pulse to be produced;
- a micropump using the movement of a diaphragm for example in order to dispense insulin or any other drug;
- a photoacoustic imaging device. In this case the acoustic pulse, generated by the movement of air entrained by the actuation of the diaphragm, is delivered to a cell or an element to be "probed". The reflection of the acoustic wave may be recorded and analyzed in order to produce images;
- an electromechanical resonator being used as a time base. In this case, the actuator must entrain a vibration mode at a given frequency. This frequency is used as a time reference for electronics such as those controlling cell phones. The greater the vibration, the more distinct it will be from the surrounding electronic noise, and the more effective its use by the electronics will be. In the case of the invention, it is possible to amplify the vibration, and hence to increase the signal-to-noise ratio in order to increase the quality of the electromagnetic resonator.

Exemplary Method for Manufacturing a Mechanical Structure of the Invention Comprising at Least Multiple Piezoelectric Actuators, Which May Advantageously be Used in a Touchpad.

The main steps of the method are illustrated by virtue of FIGS. 6a to 6g.

Figure 6A:
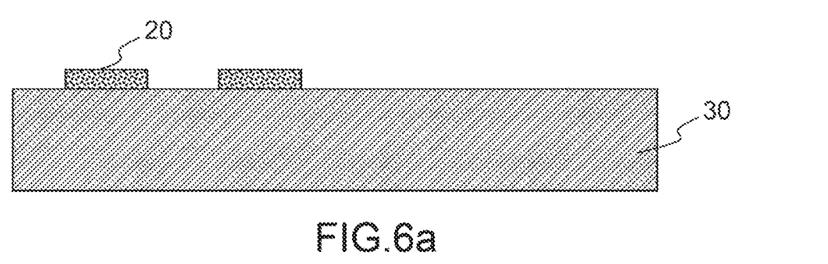
FIGS. 6a to 6g illustrate the various steps of an exemplary method for manufacturing a mechanical structure of the present invention.

In a first step illustrated in FIG. 6a, piezoelectric actuators 20, comprising at least one layer of piezoelectric material between electrodes, are produced on the surface of an elementary silicon substrate 30 that is intended to be used as an elementary amplification structure.

Figure 6B:
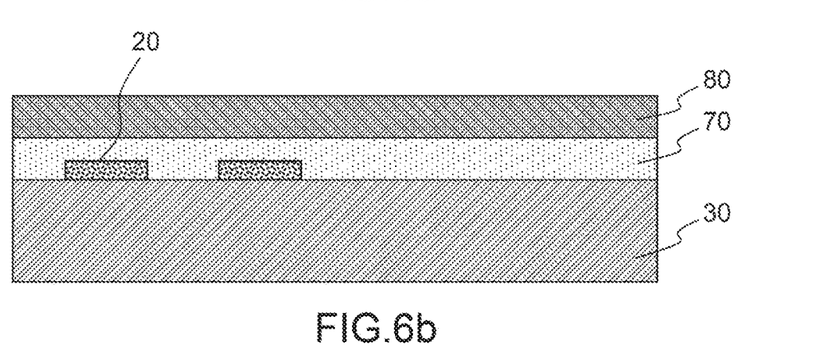

In a second step illustrated in FIG. 6b, a temporary handle 80 is bonded by means of an adhesive 70. The temporary handle may be a substrate that is potentially made of any type of material, the adhesive layer 70 may be made of a polymer, potentially being made fluid by heating.

Figure 6C:
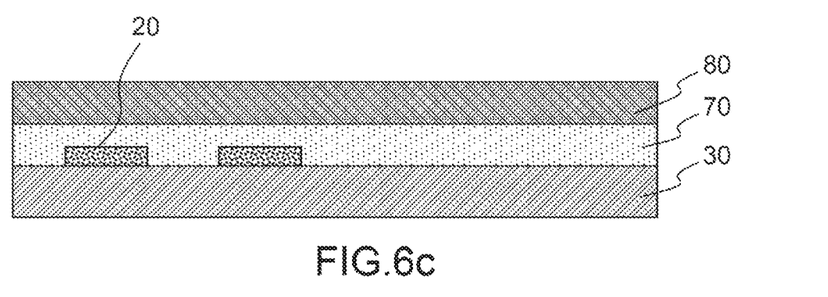

In a third step illustrated in FIG. 6c, an operation of thinning the substrate 30 (for example by means of mechanochemical polishing) is carried out.

Figure 6D:
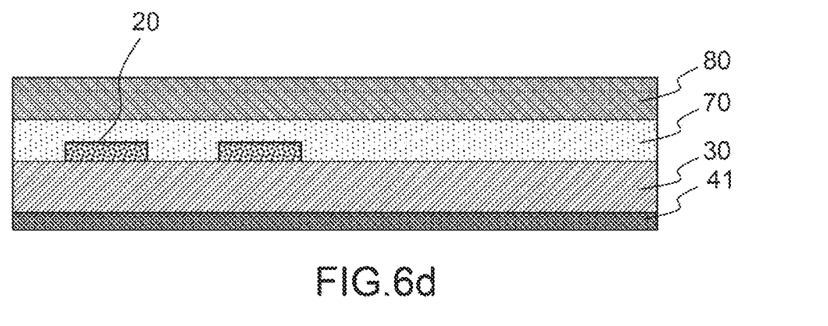

In a fourth step illustrated in FIG. 6d, a metal, for example gold, is deposited on the rear face of the substrate 30, said metal deposition being intended to be bonded to an active substrate (a glass plate for example).

Figure 6E:
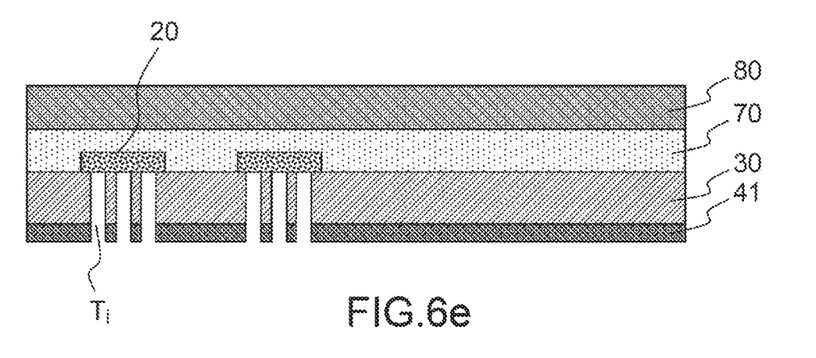

In a fifth step illustrated in FIG. 6e, trenches Ti are produced in said substrate 30 and in the adhesive layer 41 by means of etching, from the back face. The zones to be etched are defined beforehand by means of a photolithography step.

Figure 6F:
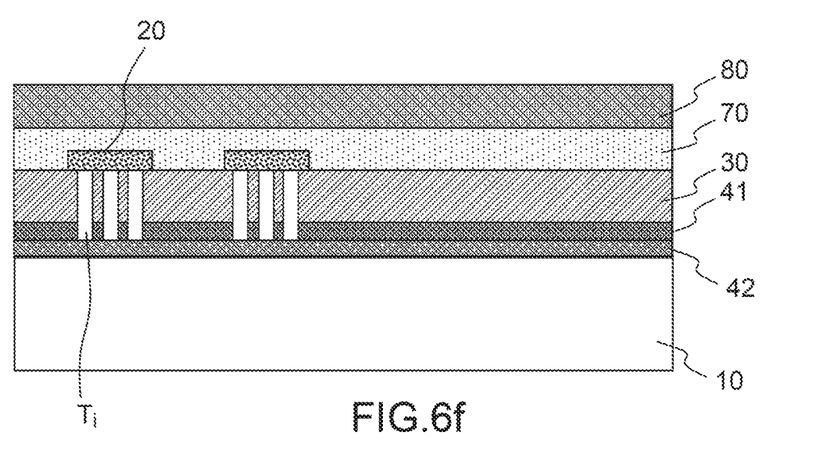

In a sixth step illustrated in FIG. 6f, an active substrate 10 through which it is sought to propagate vibrations, coated beforehand with a metal layer 42, is bonded. The bonding may be achieved by means of thermocompression after bringing the two layers 41 and 42 into contact.

Figure 6G:
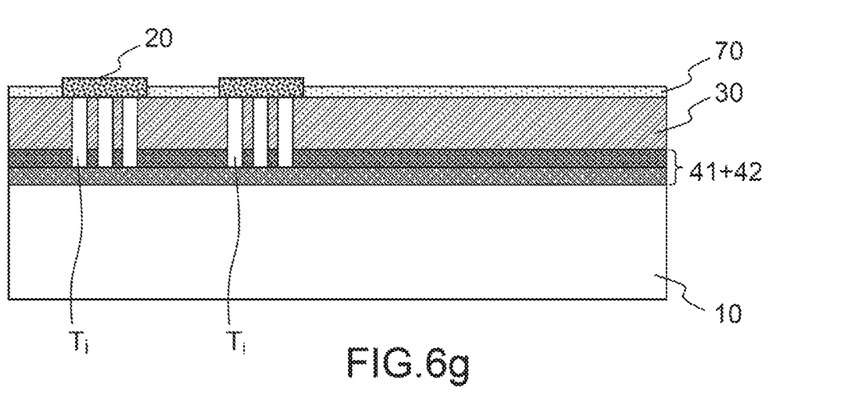

In a seventh step illustrated in FIG. 6g, said temporary handle 80 is debonded and a step of (either partially, as shown, or entirely) removing the bonding layer 70 from said actuators 20 is also carried out. The bonding layer may be partially removed or entirely removed as is advantageous for a polymer adhesive.

Typically, when an adhesive polymer has been used, the latter operation may be carried out by increasing the temperature (by means of any heat source), making said polymer malleable and hence allowing the temporary substrate, referred to as the temporary handle, to be detached from the assembly of the mechanical structure of the invention that has been produced.

The invention claimed is:

1. A mechanical structure comprising a stack including an active substrate and at least one actuator designed to generate vibrations at said active substrate, said stack comprising an elementary structure for amplifying said vibrations:
   positioned between said actuator and said active substrate, the structure being designed to transmit and amplify said vibrations; and
   comprising at least one trench, located between said actuator and said active substrate.

2. The mechanical structure as claimed in claim 1, wherein said elementary structure comprises a stack of layers at least one layer of which comprises said trench.

3. The mechanical structure as claimed in claim 1, wherein said trench is open at least up to said active substrate.

4. The mechanical structure as claimed in claim 1, wherein a surface of the substrate is oriented in a first plane defined by two orthogonal axes X and Y, said elementary structure comprises trenches that are distributed periodically along said first plane between said actuator and said substrate.

5. The mechanical structure as claimed in claim 1, comprising multiple actuators coupled with at least one elementary amplification structure, on said active substrate.

6. The mechanical structure as claimed in claim 1, wherein the actuator is a piezoelectric actuator.

7. The mechanical structure as claimed in claim 6, wherein the piezoelectric actuator comprises at least one layer of piezoelectric material that may be made of PZT, AlN, LNO or BST.

8. The mechanical structure as claimed in claim 1, wherein the actuator comprises a thermal resistor that may comprise at least one metal layer, designed to carry out a thermal actuation.

9. The mechanical structure as claimed in claim 1, wherein the actuator comprises at least one layer made of magnetic material, allowing a magnetic actuation to be carried out.

10. The mechanical structure as claimed in claim 1, wherein the active substrate is entirely or partly made of glass, polymer, or silicon.

11. The mechanical structure as claimed in claim 1, wherein the elementary structure comprises at least one portion made of silicon.

12. The mechanical structure as claimed in claim 6, comprising:
   an actuator that may comprise a piezoelectric layer;
   an elementary structure made of silicon;
   an active substrate made of glass.

13. The mechanical structure as claimed in claim 12, wherein the width of the trench or trenches is between approximately 5 μm and 1000 μm and, in the case of multiple trenches, said trenches are spaced apart by a distance that may typically be between 5 μm and 1000 μm.

* * * * *